(12) United States Patent
Chen et al.

(10) Patent No.: US 12,567,474 B2
(45) Date of Patent: Mar. 3, 2026

(54) VOLTAGE MONITOR OF MEMORY DEVICE

(71) Applicant: NANYA TECHNOLOGY CORPORATION, New Taipei City (TW)

(72) Inventors: Chih-Jen Chen, Kaohsiung City (TW); Chang-Ting Wu, Hsinchu County (TW)

(73) Assignee: NANYA TECHNOLOGY CORPORATION, New Taipei City (TW)

( * ) Notice: Subject to any disclaimer, the term of this patent is extended or adjusted under 35 U.S.C. 154(b) by 129 days.

(21) Appl. No.: 18/636,211

(22) Filed: Apr. 15, 2024

(65) Prior Publication Data

US 2025/0322895 A1     Oct. 16, 2025

(51) Int. Cl.
    *G11C 29/02*        (2006.01)
    *G11C 5/14*         (2006.01)
(52) U.S. Cl.
    CPC ............ *G11C 29/021* (2013.01); *G11C 5/147* (2013.01); *G11C 5/148* (2013.01)
(58) Field of Classification Search
    CPC ........ G11C 29/021; G11C 5/147; G11C 5/148
    USPC ........................................ 365/226
    See application file for complete search history.

(56) References Cited

U.S. PATENT DOCUMENTS

| | | | |
|---|---|---|---|
| 6,084,034 A | 7/2000 | Miyama et al. | |
| 6,208,168 B1 | 3/2001 | Rhee | |

| | | | |
|---|---|---|---|
| 8,692,585 B2 | 4/2014 | Kang | |
| 2006/0253738 A1 | 11/2006 | Stave | |
| 2009/0243667 A1 | 10/2009 | Park et al. | |
| 2011/0133773 A1* | 6/2011 | Shau | H04L 25/0278 326/87 |
| 2017/0287535 A1* | 10/2017 | Lee | G11C 7/1084 |
| 2019/0080745 A1* | 3/2019 | Kim | G11C 7/1057 |

(Continued)

FOREIGN PATENT DOCUMENTS

| | | |
|---|---|---|
| TW | 200605504 | 2/2006 |
| TW | 200945360 | 11/2009 |
| TW | 202407701 | 2/2024 |

OTHER PUBLICATIONS

"Office Action of Taiwan Counterpart Application", issued on May 9, 2025, p. 1-p. 8.

(Continued)

*Primary Examiner* — Amir Zarabian
(74) *Attorney, Agent, or Firm* — JCIPRNET

(57)        ABSTRACT

A voltage monitor is provided. The voltage monitor includes a voltage divider, a bridge switch and an off-chip driver (OCD). The voltage divider receives an internal voltage in the memory device, and divides the internal voltage to generate a sensing voltage on a sensing node. The bridge switch is coupled between the sensing node and a connecting pad. The OCD includes a control switch, a pull-up switch and a pull-down switch. A first terminal of the control switch is coupled to a high reference voltage. The pull-up switch is coupled between a second terminal of the control switch and the connecting pad. The pull-down switch is coupled between the connecting pad and a low reference voltage. The bridge switch is turned on in a test mode. The control switch, the pull-up switch and the pull-down switch are turned off in the test mode.

19 Claims, 8 Drawing Sheets

100

(56)            References Cited

U.S. PATENT DOCUMENTS

2023/0155589  A1*    5/2023   Chen ................ G11C 29/12005
                                                        365/108
2023/0410917  A1    12/2023   Yoon et al.
2024/0097658  A1     3/2024   Watanabe et al.

OTHER PUBLICATIONS

"Notice of allowance of Taiwan Counterpart Application", issued on Jan. 5, 2026, p. 1-p. 4.

* cited by examiner

VOLTAGE MONITOR OF MEMORY DEVICE

BACKGROUND

Technical Field

The disclosure generally relates to a voltage monitor of a memory device, and more particularly to a voltage monitor including an off-chip driver.

Description of Related Art

FIG. 1 illustrates a schematic diagram of an off-chip driver and a switch. Generally, a memory device needs a setting resistance value to decides at least one of operation parameter of the memory device. The setting resistance value is set by an external matching resistance value provided by an off-chip driver (OCD) 11 through a connecting pad DQPAD.

In order to decrease a number of pads of the memory device, the memory device monitors a sensing voltage VSEN corresponding to an internal voltage in the memory device through the connecting pad DQPAD. In a test mode, the switch 12 is turned on. A pull-up switch MP and a pull-down switch MN of the OCD 11 are turned off in response to enable signals PUPEN and PDNEN. Therefore, the memory device can monitor an internal voltage through the connecting pad DQPAD. However, each of the pull-up switch MP and the pull-down switch MN has a threshold voltage having a low absolute value. A leakage current may be generated corresponding to a subthreshold leakage current of the pull-up switch MP or the pull-up switch MP. In the test mode, the leakage current flowing through at least one of the pull-up switch MP and the pull-down switch MN to the connecting pad DQPAD is generated. Thus, the sensing voltage VSEN on the connecting pad DQPAD is inaccurate.

Therefore, how to decrease the leakage current in the OCD 11 to improve an accuracy of the sensing voltage VSEN on the connecting pad DQPAD is one of the research and development focuses of those skilled in the art.

SUMMARY

The disclosure provides a voltage monitor of a memory device including an off-chip driver (OCD) and connecting pad. In a test mode, the voltage monitor can decrease a leakage current in the OCD to improve an accuracy of a sensing voltage corresponding to an internal voltage in the memory device on the connecting pad.

In an embodiment of the disclosure, the voltage monitor includes a voltage divider, a bridge switch and an OCD. The voltage divider is coupled to a sensing node. The voltage divider receives an internal voltage in the memory device, and divides the internal voltage to generate a sensing voltage on the sensing node. A first terminal of the bridge switch is coupled to the sensing node. A second terminal of the bridge switch is coupled to a connecting pad. The OCD includes a control switch, a pull-up switch and a pull-down switch. A first terminal of the control switch is coupled to a high reference voltage. The pull-up switch is coupled between a second terminal of the control switch and the connecting pad. The pull-down switch is coupled between the connecting pad and a low reference voltage. The bridge switch is turned on in a test mode. The control switch, the pull-up switch and the pull-down switch are turned off in the test mode.

In an embodiment of the disclosure, the voltage monitor includes a voltage divider, a bridge switch and an OCD. The voltage divider is coupled to a sensing node. The voltage divider receives an internal voltage in the memory device, and divides the internal voltage to generate a sensing voltage on the sensing node. A first terminal of the bridge switch is coupled to the sensing node. A second terminal of the bridge switch is coupled to a connecting pad. The OCD includes a pull-up switch, a pull-down switch and a control switch. The pull-up switch is coupled between a high reference voltage and the connecting pad. A first terminal of the pull-down switch is coupled to the connecting pad. The control switch is coupled between a second terminal of the pull-down switch and a low reference voltage. The bridge switch is turned on in a test mode. The control switch, the pull-up switch and the pull-down switch are turned off in the test mode.

Based on the above, in the test mode, the control switch is turned off. Therefore, in the test mode, the voltage monitor can decrease the leakage current in the OCD to improve the accuracy of the sensing voltage on the connecting pad.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

A disclosure may be understood by reference to the following detailed description, taken in conjunction with the drawings as described below. It is noted that, for purposes of illustrative clarity and being easily understood by the readers, various drawings of this disclosure show a portion of an electronic device, and certain elements in various drawings may not be drawn to scale. In addition, the number and dimension of each device shown in drawings are only illustrative and are not intended to limit the scope of a disclosure.

Certain terms are used throughout the description and following claims to refer to particular components. As one skilled in the art will understand, electronic equipment manufacturers may refer to a component by different names. This document does not intend to distinguish between components that differ in name but not function. In the following description and in the claims, the terms "include", "comprise" and "have" are used in an open-ended fashion, and thus should be interpreted to mean "include, but not limited to . . . ". Thus, when the terms "include", "comprise" and/or "have" are used in the description of a disclosure, the corresponding features, areas, steps, operations and/or components would be pointed to existence, but not limited to the existence of one or a plurality of the corresponding features, areas, steps, operations and/or components.

It will be understood that when an element is referred to as being "coupled to", "connected to", or "conducted to" another element, it may be directly connected to the other element and established directly electrical connection, or intervening elements may be presented therebetween for relaying electrical connection (indirectly electrical connection). In contrast, when an element is referred to as being "directly coupled to", "directly conducted to", or "directly connected to" another element, there are no intervening elements presented.

Figure 1:
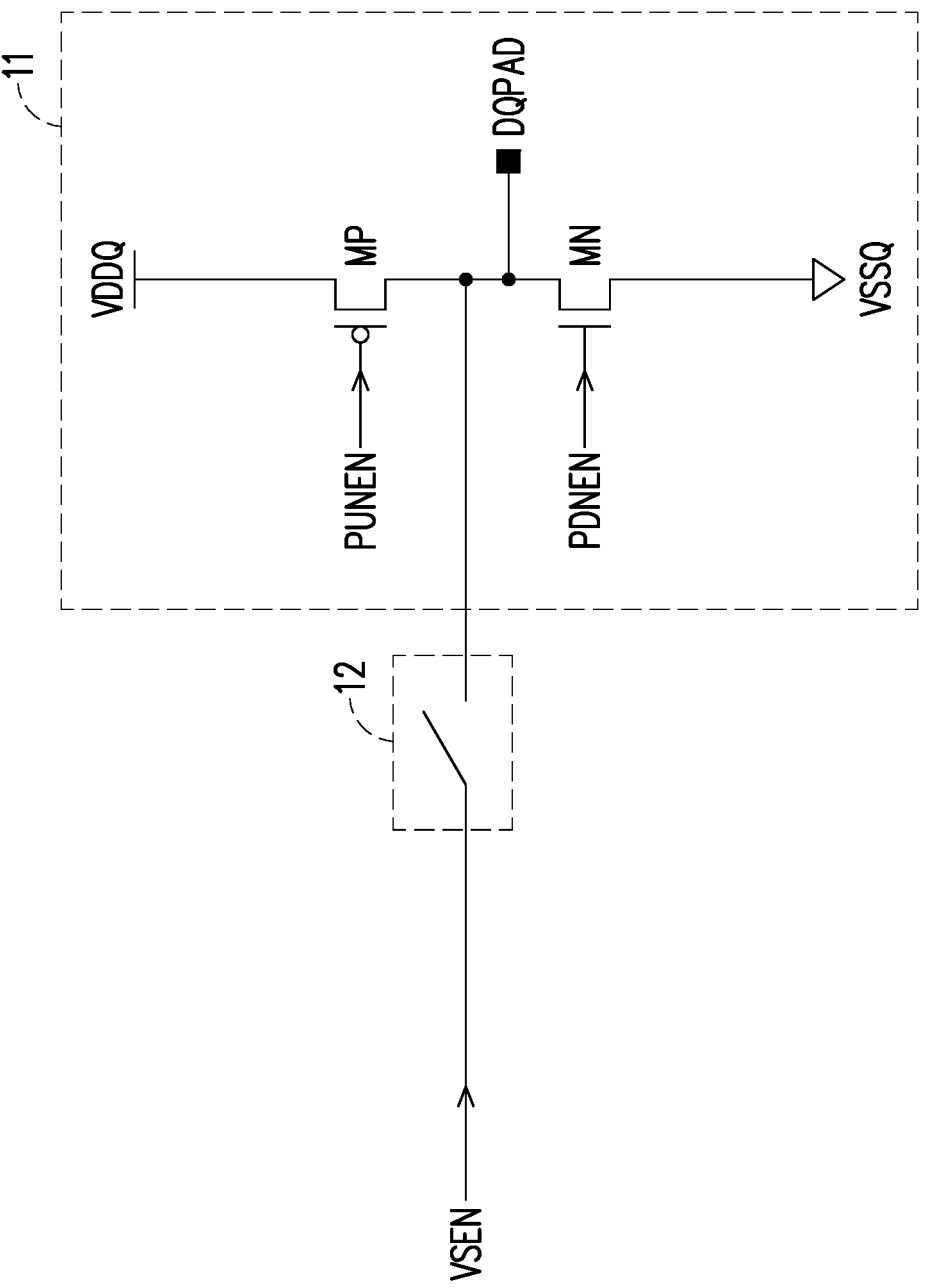
FIG. 1 illustrates a schematic diagram of an off-chip driver and a switch.
Figure 2:
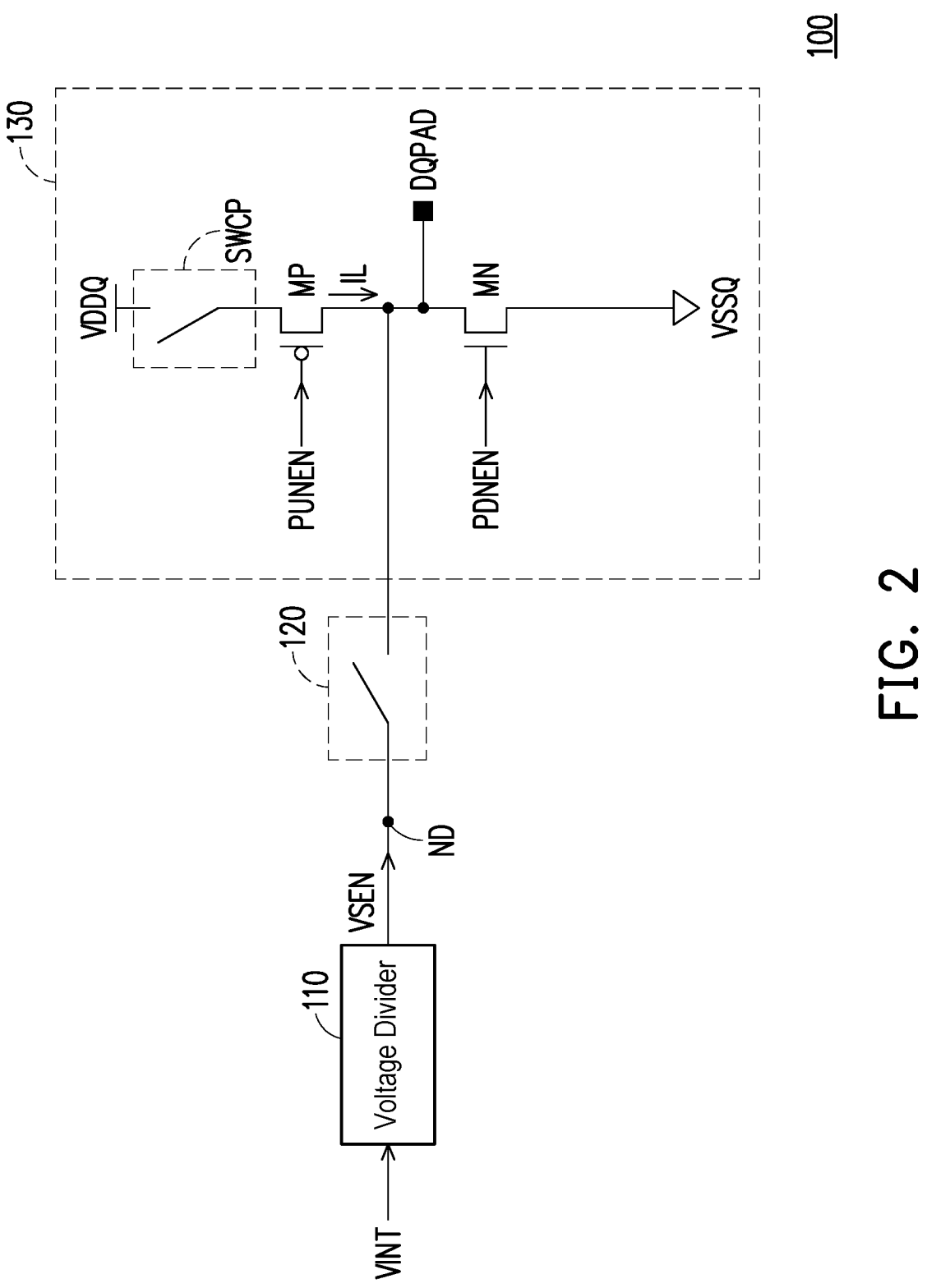
FIG. 2 illustrates a schematic diagram of a voltage monitor according to an embodiment of the disclosure.

Please refer to FIG. 2, FIG. 2 illustrates a schematic diagram of a voltage monitor according to an embodiment of the disclosure. In the embodiment, the voltage monitor 100 includes a voltage divider 110, a bridge switch 120 and an off-chip driver (OCD) 130. The voltage divider 110 is coupled to a sensing node ND. The voltage divider 110 receives an internal voltage VINT in the memory device. The voltage divider 110 divides the internal voltage VINT to generate a sensing voltage VSEN on the sensing node ND. The sensing voltage VSEN is proportional to the internal voltage VINT. For example, the memory device may be a dynamic random-access memory (DRAM). The internal voltage VINT may be one of the internal reference voltages VDD, VSS, VREFDQ, a high reference voltage VDDQ and a low reference voltage VSSQ for the memory device, but the disclosure is not limited thereto.

In the embodiment, a first terminal of the bridge switch 120 is coupled to the sensing node ND. A second terminal of the bridge switch 120 is coupled to a connecting pad DQPAD.

In the embodiment, the OCD 130 includes a control switch SWCP, a pull-up switch MP and a pull-down switch MN. A first terminal of the control switch SWCP is coupled to the high reference voltage VDDQ. The pull-up switch MP is coupled between a second terminal of the control switch SWCP and the connecting pad DQPAD. The pull-down switch MN is coupled between the connecting pad DQPAD and the low reference voltage VSSQ. In the embodiment, the bridge switch 120 is turned on in a test mode. The control switch SWCP, the pull-up switch MP and the pull-down switch MN are turned off in the test mode.

It should be noted, in the test mode, the control switch SWCP is turned off. Therefore, in the test mode, the voltage monitor 100 can decrease the leakage current IL flowing the pull-up switch MP in the OCD. Therefore, an accuracy of a sensing voltage VSEN on the connecting pad DQPAD can be improved.

In the embodiment, the bridge switch 120 is turned off in a normal mode. The control switch SWCP is turned on in the normal mode. Therefore, the OCD 130 operates in the normal mode. For example, the OCD 130 provides external matching resistance value through the connecting pad DQPAD in the normal mode.

In the embodiment, the pull-up switch MP could be implemented by a p-type transistor, but the disclosure is not limited thereto. The pull-down switch MN could be implemented by a n-type transistor, but the disclosure is not limited thereto. A control terminal of the pull-up switch MP receives an enable signal PUPEN. A control terminal of the pull-down switch MN receives an enable signal PDNEN. In the test mode, the pull-up switch MP is turned off in response to the enable signal PUPEN. In the test mode, the pull-down switch MN is turned off in response to the enable signal PDNEN.

Figure 3:
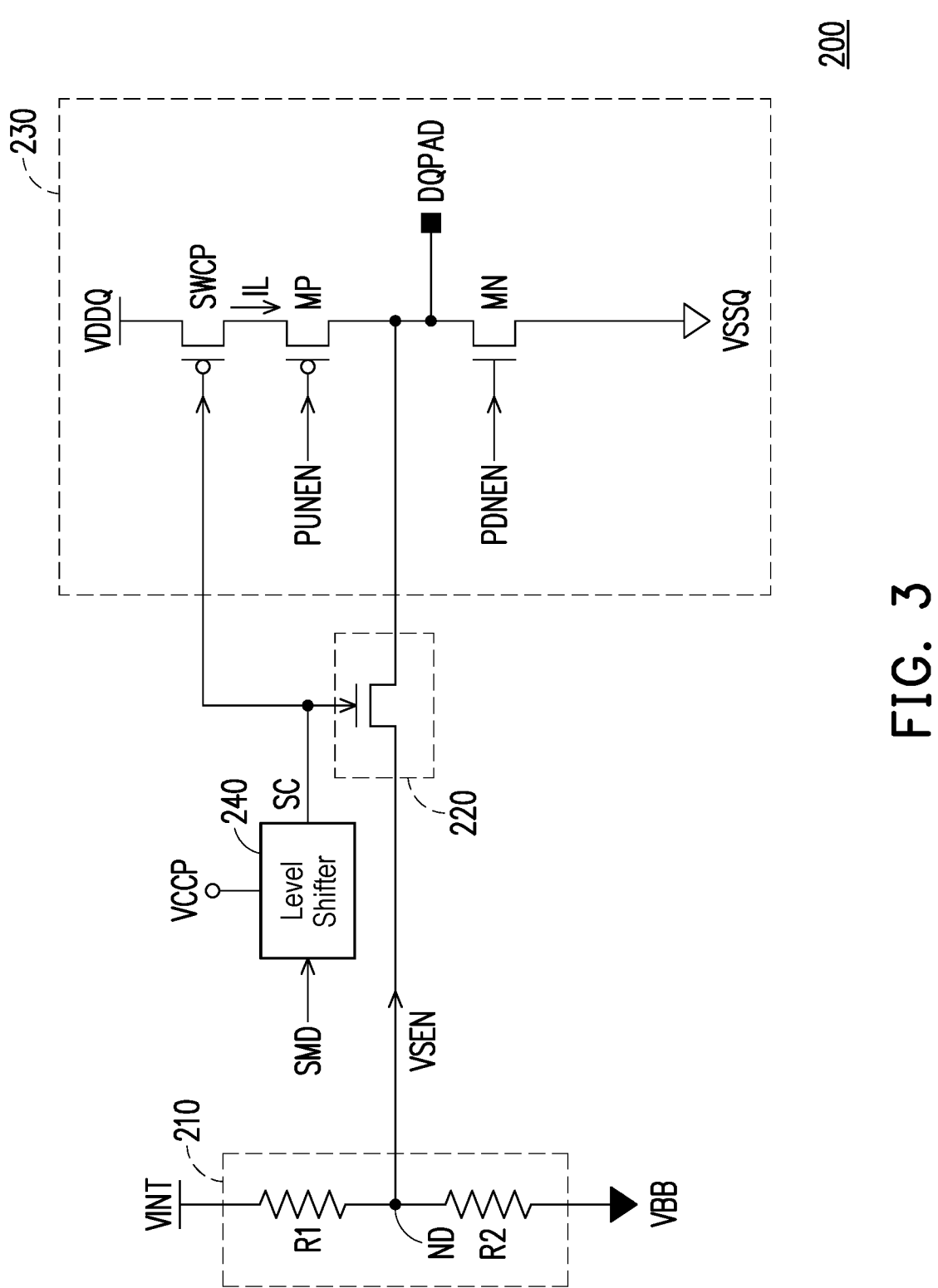
FIG. 3 illustrates a schematic diagram of a voltage monitor according to an embodiment of the disclosure.

Please refer to FIG. 3, FIG. 3 illustrates a schematic diagram of a voltage monitor according to an embodiment of the disclosure. In the embodiment, the voltage monitor 200 includes a voltage divider 210, a bridge switch 220, a OCD 230 and a level shifter 240. The voltage divider 210 is coupled to a sensing node ND. The voltage divider 210 includes dividing resistors R1 and R2. The dividing resistor R1 is coupled between the internal voltage VINT and the sensing node ND. The dividing resistor R2 is coupled between the sensing node ND and a background voltage VBB. The voltage divider 210 divides the internal voltage VINT to generate the sensing voltage VSEN based on resistance values of the dividing resistors R1 and R2.

In the embodiment, the bridge switch 220 is coupled between the sensing node ND and the connecting pad DQPAD. The bridge switch 220 could be implemented by a n-type transistor, but the disclosure is not limited thereto.

In the embodiment, the OCD 230 includes the control switch SWCP, the pull-up switch MP and the pull-down switch MN. A connection between the control switch SWCP, the pull-up switch MP and the pull-down switch MN has been clearly explained in the embodiment of FIG. 2, so it will not be repeated here. Detailly, the control switch SWCP could be implemented by a p-type transistor. It should be noted, an absolute value of a threshold voltage of the control switch SWCP is higher than an absolute value of a threshold voltage of the pull-up switch MP. Therefore, the control switch SWCP blocks a generation of the leakage current IL flowing through the pull-up switch MP in the test mode.

In the embodiment, the level shifter 240 is coupled to a control terminal of the bridge switch 220 and a control terminal of the control switch SWCP. The level shifter 240 receives a mode signal SMD and generates a control signal SC in response to the mode signal SMD. In the test mode, the mode signal SMD has a first logic level, and the control signal SC has a first voltage level. In the normal mode, the mode signal SMD has a second logic level, and the control signal SC has a second voltage level.

For example, in the test mode, the mode signal SMD has a high logic level. The level shifter 240 shifts a voltage value of the mode signal SMD to generate the control signal SC having a high voltage level VCCP (that is, the first voltage level). The bridge switch 220 is turned on in response to the control signal SC having the first voltage level. The control switch SWCP is turned off in response to the control signal SC having the first voltage level.

For example, in the normal mode, the mode signal SMD has a low logic level. The level shifter 240 shifts the voltage value of the mode signal SMD to generate the control signal SC having a low voltage level (that is, the second voltage level). The bridge switch 220 is turned off in response to the control signal SC having the second voltage level. The control switch SWCP is turned on in response to the control signal SC having the second voltage level.

In some embodiments, the level shifter 240 could be implemented by a source follower, a buffer or a converter, but the disclosure is not limited thereto.

Figure 4:
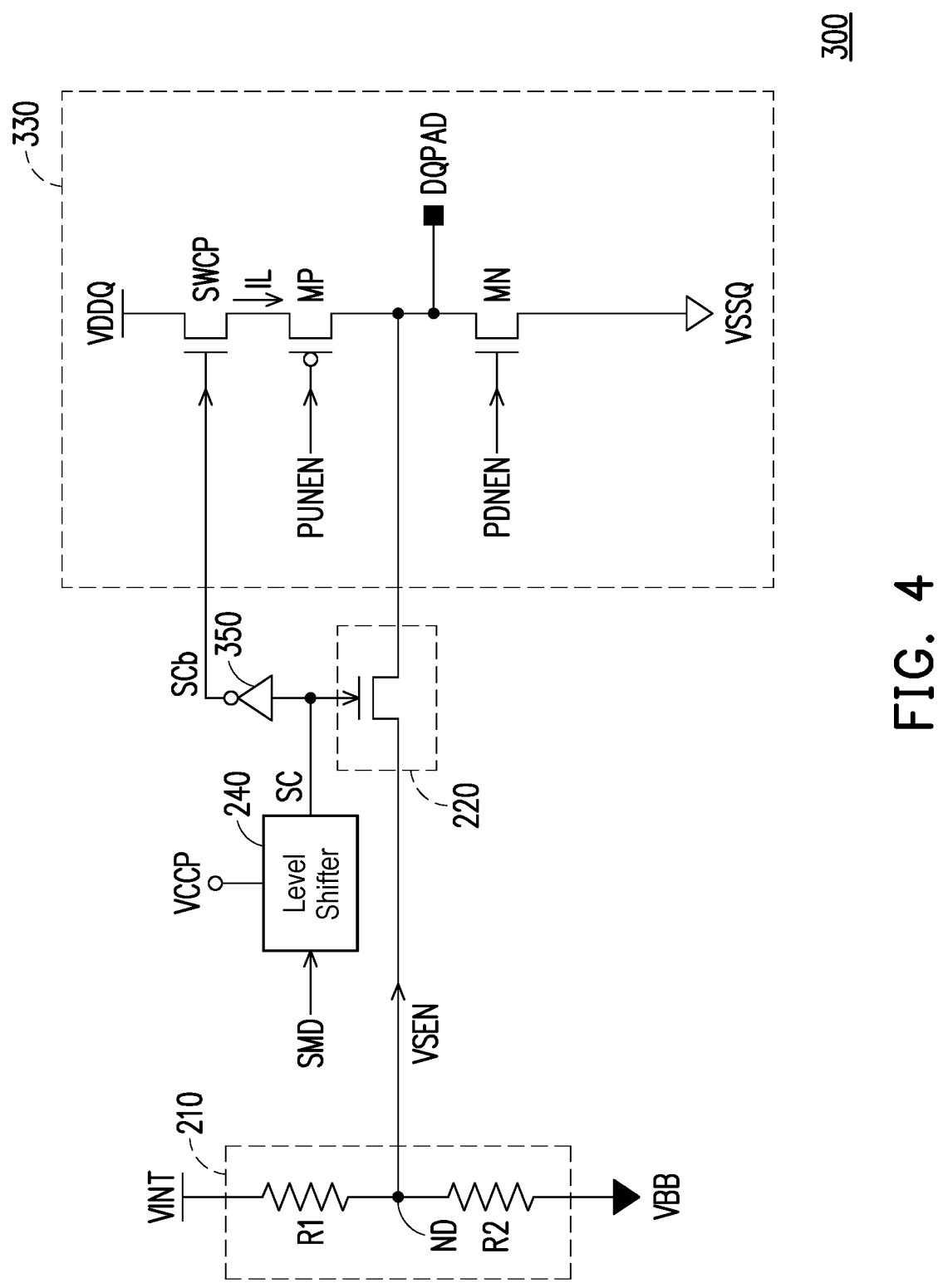
FIG. 4 illustrates a schematic diagram of a voltage monitor according to an embodiment of the disclosure.

Please refer to FIG. 4, FIG. 4 illustrates a schematic diagram of a voltage monitor according to an embodiment of the disclosure. In the embodiment, the voltage monitor 300 includes the voltage divider 210, the bridge switch 220, a OCD 330, the level shifter 240 and an inverter 350. Connections and operations of the voltage divider 210, the bridge switch 220 and the level shifter 240 have been clearly explained in the embodiment of FIG. 3, so it will not be repeated here.

In the embodiment, the OCD 330 includes the control switch SWCP, the pull-up switch MP and the pull-down switch MN. The connection between the control switch SWCP, the pull-up switch MP and the pull-down switch MN has been clearly explained in the embodiment of FIG. 2, so it will not be repeated here. Detailly, the control switch SWCP could be implemented by a n-type transistor. It should be noted, an absolute value of the threshold voltage of the control switch SWCP is higher than an absolute value of the threshold voltage of the pull-up switch MP. Therefore, the control switch SWCP blocks a generation of the leakage current IL flowing through the pull-up switch MP in the test mode.

In the embodiment, an input terminal of the inverter 350 is coupled to the level shifter 240. An output terminal of the inverter 350 is coupled to a control terminal of the control switch SC. The inverter 350 generates an inverted control signal SCb according to the control signal SC. The inverted control signal SCb is complementary to the control signal SC. In the test mode, the bridge switch 220 is turned on in response to the control signal SC having the first voltage level. In the test mode, the control switch SWCP is turned off in response to the inverted control signal SCb having the second voltage level.

Figure 5:
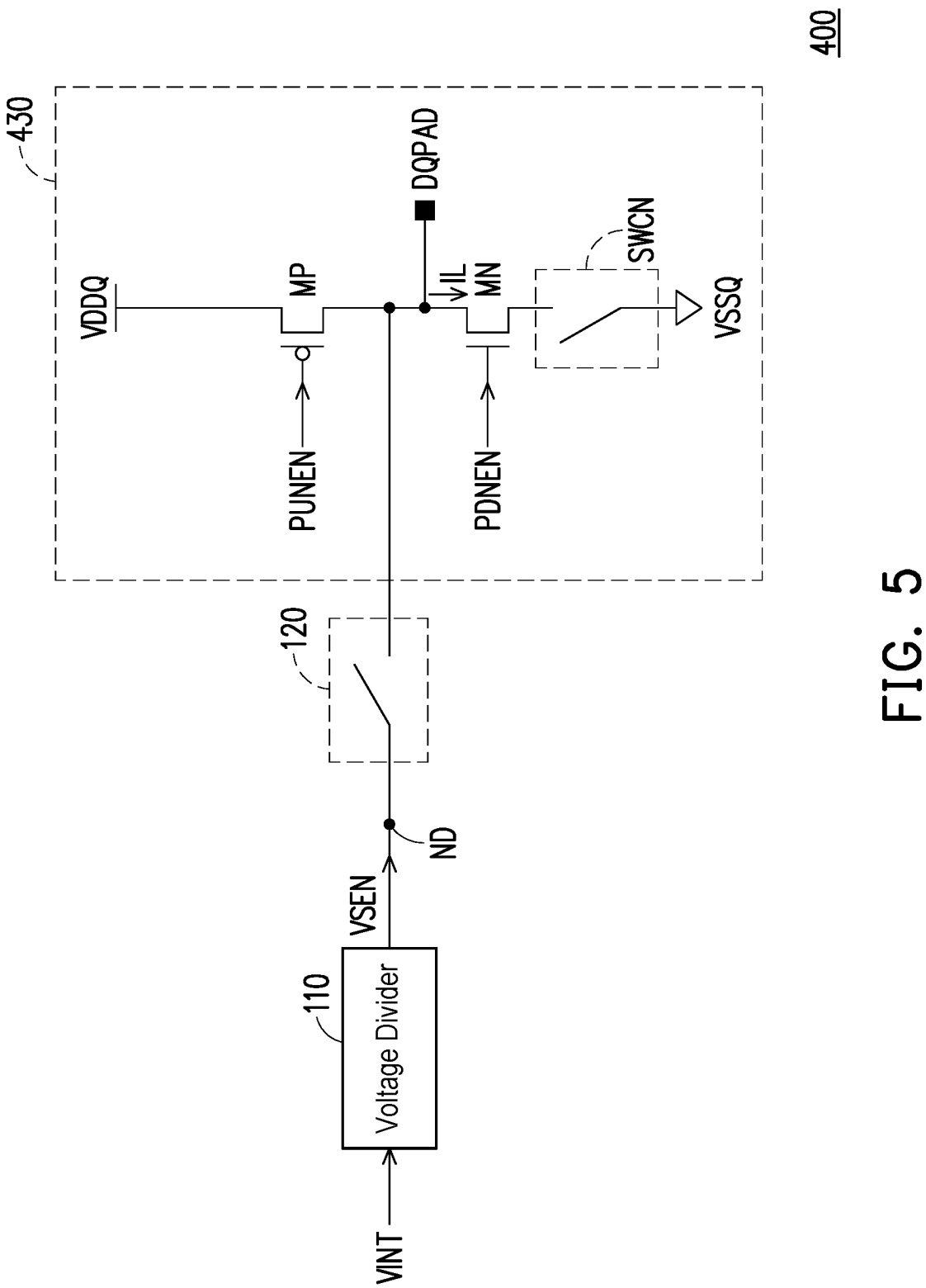
FIG. 5 illustrates a schematic diagram of a voltage monitor according to an embodiment of the disclosure.

Please refer to FIG. 5, FIG. 5 illustrates a schematic diagram of a voltage monitor according to an embodiment of the disclosure. In the embodiment, the voltage monitor 400 includes the voltage divider 110, the bridge switch 120 and a OCD 430. The voltage divider 110 and the bridge switch 120 have been clearly explained in the embodiment of FIG. 2, so it will not be repeated here. In the embodiment, the OCD 430 includes the pull-up switch MP and the pull-down switch MN and a control switch SWCN. The pull-up switch MP is coupled between the high reference voltage VDDQ and the connecting pad DQPAD. A first terminal of the pull-down switch MN is coupled to the connecting pad DQPAD. The control switch SWCN is coupled between a second terminal of the pull-down switch MN and the low reference voltage VSSQ. In the embodiment, the bridge switch 120 is turned on in the test mode. The control switch SWCN, the pull-up switch MP and the pull-down switch MN are turned off in the test mode.

It should be noted, in the test mode, the control switch SWCN is turned off. Therefore, in the test mode, the voltage monitor 400 can decrease the leakage current IL flowing the pull-down switch MN in the OCD to improve the accuracy of the sensing voltage VSEN on the connecting pad DQPAD.

In the embodiment, the bridge switch 120 is turned off in the normal mode. The control switch SWCN is turned on in the normal mode. Therefore, the OCD 430 operates in the normal mode.

In the embodiment, the pull-up switch MP could be implemented by a p-type transistor. The pull-down switch MN could be implemented by a n-type transistor. In the test mode, the pull-up switch MP is turned off in response to the enable signal PUPEN. In the test mode, the pull-down switch MN is turned off in response to the enable signal PDNEN.

Figure 6:
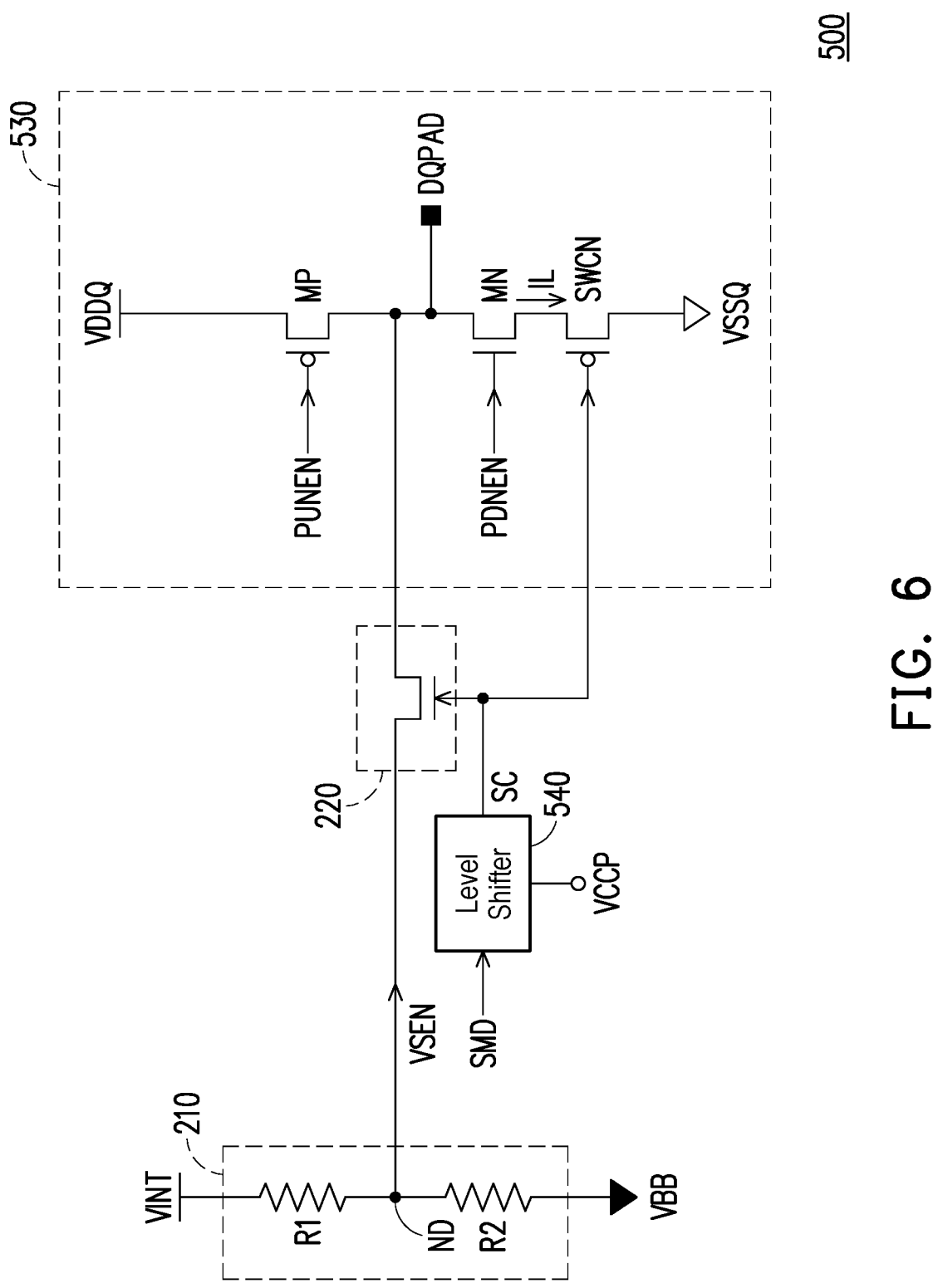
FIG. 6 illustrates a schematic diagram of a voltage monitor according to an embodiment of the disclosure.

Please refer to FIG. 6, FIG. 6 illustrates a schematic diagram of a voltage monitor according to an embodiment of the disclosure. In the embodiment, the voltage monitor 500 includes a voltage divider 210, a bridge switch 220, a OCD 530 and a level shifter 540. The voltage divider 210 receives an internal voltage VINT in the memory device. The voltage divider 210 includes the dividing resistors R1 and R2. A connection and an operation of the voltage divider 210 has been clearly explained in the embodiment of FIG. 3, so it will not be repeated here.

In the embodiment, the bridge switch 220 is coupled between the sensing node ND and the connecting pad DQPAD. The bridge switch 220 could be implemented by a n-type transistor, but the disclosure is not limited thereto.

In the embodiment, the OCD 530 includes the pull-up switch MP, the pull-down switch MN and the control switch SWCN. A connection between the control switch SWCN, the pull-up switch MP and the pull-down switch MN has been clearly explained in the embodiment of FIG. 5, so it will not be repeated here. Detailly, the control switch SWCN could be implemented by a p-type transistor, but the disclosure is not limited thereto. It should be noted, an absolute value of a threshold voltage of the control switch SWCN is higher than an absolute value of a threshold voltage of the pull-down switch MN. Therefore, the control switch SWCN blocks a generation of the leakage current IL flowing through the pull-down switch MN in the test mode.

In the embodiment, the level shifter 540 is coupled to a control terminal of the bridge switch 220 and a control terminal of the control switch SWCN. The level shifter 240 receives the mode signal SMD and generates the control signal SC in response to the mode signal SMD. In the test mode, the mode signal SMD has the first logic level, and the control signal SC has the first voltage level. In the normal mode, the mode signal SMD has the second logic level, and the control signal SC has the second voltage level.

For example, in the test mode, the mode signal SMD has the high logic level. The level shifter 240 shifts the voltage value of the mode signal SMD to generate the control signal SC having the high voltage level VCCP (that is, the first voltage level). The bridge switch 220 is turned on in response to the control signal SC having the first voltage level. The control switch SWCP is turned off in response to the control signal SC having the first voltage level.

For example, in the normal mode, the mode signal SMD has the low logic level. The level shifter 540 shifts the voltage value of the mode signal SMD to generate the control signal SC having the low voltage level (that is, the second voltage level). The bridge switch 220 is turned off in response to the control signal SC having the second voltage level. The control switch SWCN is turned on in response to the control signal SC having the second voltage level.

In some embodiments, the level shifter 540 could be implemented by a source follower, a buffer or a converter, but the disclosure is not limited thereto.

Figure 7:
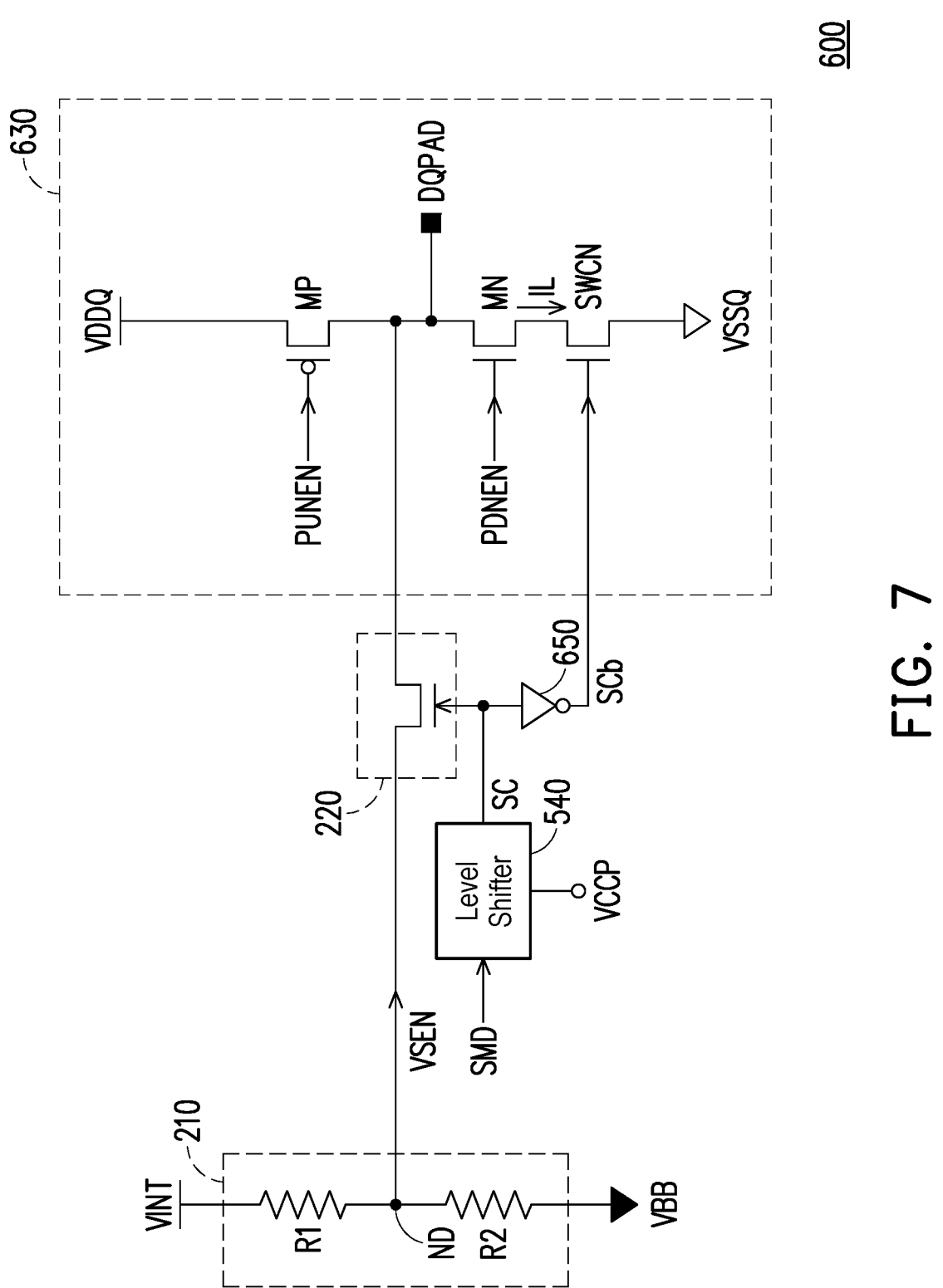
FIG. 7 illustrates a schematic diagram of a voltage monitor according to an embodiment of the disclosure.

Please refer to FIG. 7, FIG. 7 illustrates a schematic diagram of a voltage monitor according to an embodiment of the disclosure. In the embodiment, the voltage monitor 600 includes the voltage divider 210, the bridge switch 220, a OCD 630, the level shifter 540 and an inverter 650. Connections and operations of the voltage divider 210, the bridge switch 220 and the level shifter 540 have been clearly explained in the embodiments of FIG. 3 and FIG. 6, so it will not be repeated here.

In the embodiment, the OCD 630 includes the pull-up switch MP, the pull-down switch MN and the control switch SWCN. The connection between the control switch SWCN, the pull-up switch MP and the pull-down switch MN has been clearly explained in the embodiment of FIG. 5, so it will not be repeated here. Detailly, the control switch SWCN could be implemented by a n-type transistor, but the disclosure is not limited thereto. It should be noted, an absolute value of the threshold voltage of the control switch SWCN is higher than an absolute value of the threshold voltage of the pull-down switch MN. Therefore, the control switch SWCN blocks a generation of the leakage current IL flowing through the pull-down switch MN in the test mode.

In the embodiment, an input terminal of the inverter 650 is coupled to the level shifter 540. An output terminal of the inverter 650 is coupled to a control terminal of the control switch SC. The inverter 650 generates the inverted control signal SCb according to the control signal SC. The inverted control signal SCb is complementary to the control signal SC. In the test mode, the bridge switch 220 is turned on in response to the control signal SC having the first voltage level. In the test mode, the control switch SWCP is turned off in response to the inverted control signal SCb having the second voltage level.

Figure 8:
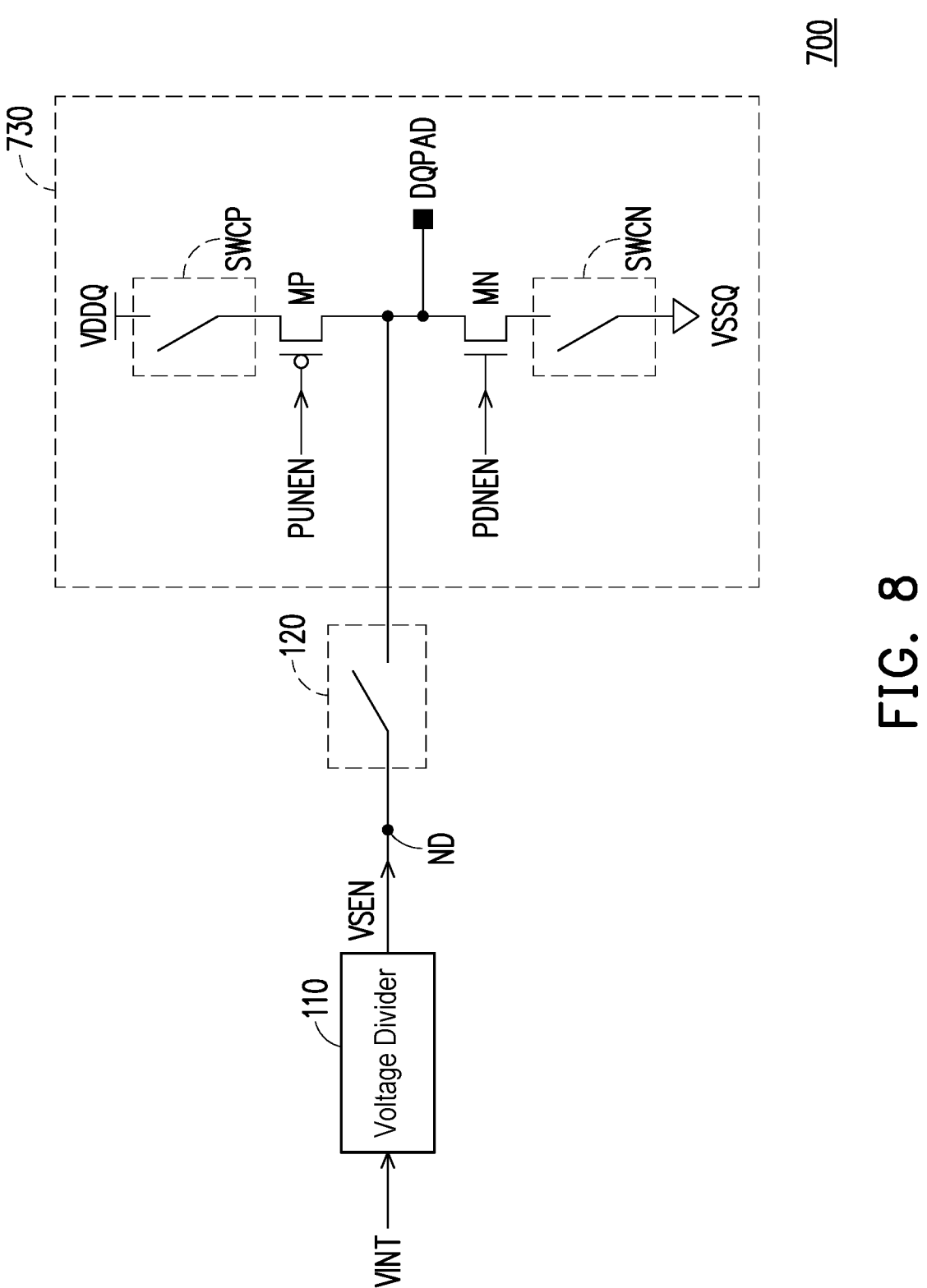
FIG. 8 illustrates a schematic diagram of a voltage monitor according to an embodiment of the disclosure.

Please refer to FIG. 8, FIG. 8 illustrates a schematic diagram of a voltage monitor according to an embodiment of the disclosure. In the embodiment, the voltage monitor 700 includes the voltage divider 110, the bridge switch 120 and a OCD 730. The voltage divider 110 and the bridge switch 120 have been clearly explained in the embodiment of FIG. 2, so it will not be repeated here. The OCD 730 includes the pull-up switch MP and the pull-down switch MN, the control switch SWCP and the control switch SWCN. The first terminal of the control switch SWCP is coupled to the high reference voltage VDDQ. The pull-up switch MP is coupled between a second terminal of the control switch SWCP and the connecting pad DQPAD. A first terminal of the pull-down switch MN is coupled to the connecting pad DQPAD. The control switch SWCN is coupled between a second terminal of the pull-down switch MN and the low reference voltage VSSQ. In the embodiment, the bridge switch 120 is turned on in the test mode. The control switch SWCP, the pull-up switch MP, the pull-down switch MN and the control switch SWCN are turned off in the test mode.

It should be noted, in the test mode, the control switch SWCP and the control switch SWCN are turned off. Therefore, in the test mode, the voltage monitor 700 can decrease the leakage current flowing the pull-up switch MP and decrease the leakage current flowing the pull-down switch MN, so as to improve the accuracy of the sensing voltage VSEN on the connecting pad DQPAD.

In the embodiment, the bridge switch 120 is turned off in the normal mode. The control switch SWCP and the control switch SWCN are turned on in the normal mode. Therefore, the OCD 730 operates in the normal mode.

In view of the foregoing, the voltage monitor includes a voltage divider, a bridge switch and an OCD. The OCD includes a control switch. In the test mode, the control switch is turned off. Therefore, the voltage monitor can decrease the leakage current in the OCD in the test mode. In this way, the voltage monitor can improve the accuracy of a sensing voltage on the connecting pad.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A voltage monitor of a memory device, comprising:
    a voltage divider, coupled to a sensing node, configured to receive an internal voltage in the memory device, and divide the internal voltage to generate a sensing voltage on the sensing node;
    a bridge switch, a first terminal of the bridge switch is coupled to the sensing node, a second terminal of the bridge switch is coupled to a connecting pad; and
    an off-chip driver, comprising:
        a control switch, a first terminal of the control switch is coupled to a high reference voltage;
        a pull-up switch, coupled between a second terminal of the control switch and the connecting pad; and
        a pull-down switch, coupled between the connecting pad and a low reference voltage,
    wherein the bridge switch is turned on in a test mode, and
    wherein the control switch, the pull-up switch and the pull-down switch are turned off in the test mode.

2. The voltage monitor of claim 1, wherein:
    the bridge switch is turned off in a normal mode, and
    the control switch is turned on in the normal mode.

3. The voltage monitor of claim 1, wherein an absolute value of a threshold voltage of the control switch is higher than an absolute value of a threshold voltage of the pull-up switch.

4. The voltage monitor of claim 1, further comprising:
    a level shifter, coupled to a control terminal of the bridge switch and a control terminal of the control switch, configured to receive a mode signal and generate a control signal in response to the mode signal,
    wherein in the test mode, the mode signal has a first logic level, and the control signal has a first voltage level, and
    wherein in a normal mode, the mode signal has a second logic level, and the control signal has a second voltage level.

5. The voltage monitor of claim 4, wherein in the test mode:
    the bridge switch is turned on in response to the control signal having the first voltage level, and
    the control switch is turned off in response to the control signal having the first voltage level.

6. The voltage monitor of claim 4, wherein:
    the bridge switch is implemented by a n-type transistor, and
    the control switch is implemented by a p-type transistor.

7. The voltage monitor of claim 1, further comprising:
    a level shifter, coupled to a control terminal of the bridge switch, and configured to receive a mode signal and generate a control signal in response to the mode signal; and
    an inverter, an input terminal of the inverter is coupled to the level shifter, an output terminal of the inverter is coupled to a control terminal of the control switch, configured to generate an inverted control signal according to the control signal,
    wherein in the test mode, the mode signal has a first logic level, and the control signal has a first voltage level, and
    wherein in a normal mode, the mode signal has a second logic level, and the control signal has a second voltage level.

8. The voltage monitor of claim 7, wherein in the test mode:
    the bridge switch is turned on in response to the control signal having the first voltage level, and
    the control switch is turned off in response to the inverted control signal having the second voltage level.

9. The voltage monitor of claim 7, wherein each of the bridge switch and the control switch is implemented by a n-type transistor.

10. The voltage monitor of claim 1, wherein the voltage divider comprises:

a first dividing resistor, coupled between the internal voltage and the sensing node; and a second dividing resistor, coupled between the sensing node and a background voltage.

11. A voltage monitor of a memory device, comprising:

a voltage divider, coupled to a sensing node, configured to receive an internal voltage in the memory device, and divide the internal voltage to generate a sensing voltage on the sensing node;

a bridge switch, a first terminal of the bridge switch is coupled to the sensing node, a second terminal of the bridge switch is coupled to a connecting pad; and an off-chip driver, comprising:

a pull-up switch, coupled between a high reference voltage and the connecting pad;

a pull-down switch, a first terminal of the pull-down switch is coupled to the connecting pad; and a control switch, coupled between a second terminal of the pull-down switch and a low reference voltage, wherein the bridge switch is turned on in a test mode, and wherein the control switch, pull-up switch and the pull-down switch are turned off in the test mode.

12. The voltage monitor of claim 11, wherein:

the bridge switch is turned off in a normal mode, and the control switch is turned on in the normal mode.

13. The voltage monitor of claim 11, wherein:

an absolute value of a threshold voltage of the control switch is higher than an absolute value of a threshold voltage of the pull-down switch.

14. The voltage monitor of claim 11, further comprising:

a level shifter, coupled to a control terminal of the bridge switch and a control terminal of the control switch, configured to receive a mode signal and generate a control signal in response to the mode signal, wherein in the test mode, the mode signal has a first logic level, and the control signal has a first voltage level, and wherein in a normal mode, the mode signal has a second logic level, and the control signal has a second voltage level.

15. The voltage monitor of claim 14, wherein:

the bridge switch is turned on in response to the control signal having the first voltage level, and the control switch is turned off in response to the control signal having the first voltage level.

16. The voltage monitor of claim 14, wherein:

the bridge switch is implemented by a n-type transistor, and the control switch is implemented by a p-type transistor.

17. The voltage monitor of claim 11, further comprising:

a level shifter, coupled to a control terminal of the bridge switch, and configured to receive a mode signal and generate a control signal in response to the mode signal; and an inverter, an input terminal of the inverter is coupled to the level shifter, an output terminal of the inverter is coupled to a control terminal of the control switch, configured to generate an inverted control signal according to the control signal, wherein in the test mode, the mode signal has a first logic level, and the control signal has a first voltage level, and wherein in a normal mode, the mode signal has a second logic level, and the control signal has a second voltage level.

18. The voltage monitor of claim 17, wherein:

the bridge switch is turned on in response to the control signal having the first voltage level, and the control switch is turned off in response to the inverted control signal having the second voltage level.

19. The voltage monitor of claim 17, wherein each of the bridge switch and the control switch is implemented by a n-type transistor.

* * * * *